United States Patent [19]

Vallancourt

[11] Patent Number: 5,760,616
[45] Date of Patent: Jun. 2, 1998

[54] CURRENT COPIERS WITH IMPROVED ACCURACY

[75] Inventor: David Gerard Vallancourt, Macungie, Pa.

[73] Assignee: Lucent Technologies, Inc., Murray Hill, N.J.

[21] Appl. No.: 523,703

[22] Filed: Sep. 5, 1995

[51] Int. Cl.⁶ .................................................. G11C 27/02
[52] U.S. Cl. ............................ 327/91; 327/94; 341/145
[58] Field of Search ................................ 327/91, 94, 103; 341/120, 131, 145, 156

[56] References Cited

U.S. PATENT DOCUMENTS

| | | | |
|---|---|---|---|
| 4,560,890 | 12/1985 | Masuda et al. | 307/355 |
| 4,591,830 | 5/1986 | Hanna | 340/347 |
| 4,603,267 | 7/1986 | Kowallek | 307/362 |
| 4,697,152 | 9/1987 | Westwick | 330/9 |
| 4,748,418 | 5/1988 | Kerth | 330/9 |
| 4,866,368 | 9/1989 | Bird | 327/91 |
| 4,910,518 | 3/1990 | Kim et al. | 341/155 |
| 4,989,003 | 1/1991 | Sauer | 341/136 |
| 4,996,529 | 2/1991 | Connell | 341/118 |
| 5,021,692 | 6/1991 | Hughes | 327/94 |
| 5,059,832 | 10/1991 | Hughes | 327/94 |
| 5,070,259 | 12/1991 | Rempfer et al. | 307/350 |
| 5,124,704 | 6/1992 | Kase et al. | 341/120 |
| 5,140,186 | 8/1992 | Ito et al. | 307/350 |
| 5,140,326 | 8/1992 | Bacrania et al. | 341/159 |
| 5,148,054 | 9/1992 | Demler | 307/352 |
| 5,151,780 | 9/1992 | Chapman | 358/21 R |
| 5,164,726 | 11/1992 | Bernstein et al. | 341/120 |
| 5,173,698 | 12/1992 | Gulczynski | 341/158 |
| 5,194,866 | 3/1993 | Imaizumi et al. | 341/156 |
| 5,194,867 | 3/1993 | Fisher | 341/159 |
| 5,214,430 | 5/1993 | Gulczynski | 341/120 |
| 5,262,685 | 11/1993 | Demler et al. | 307/353 |
| 5,281,805 | 1/1994 | Sauer | 250/214 R |
| 5,291,198 | 3/1994 | Dingwall et al. | 341/159 |
| 5,296,752 | 3/1994 | Groeneveld et al. | 327/91 |
| 5,311,085 | 5/1994 | Pelgrom et al. | 307/494 |
| 5,319,266 | 6/1994 | Chu et al. | 307/494 |
| 5,332,931 | 7/1994 | Crispie et al. | 307/355 |
| 5,336,945 | 8/1994 | Ikeda | 307/355 |
| 5,349,245 | 9/1994 | Hughes et al. | 327/94 |
| 5,355,135 | 10/1994 | Redfern | 341/156 |
| 5,410,197 | 4/1995 | Krenik | 327/52 |
| 5,572,153 | 11/1996 | Vallncourt et al. | 327/77 |

OTHER PUBLICATIONS

S.J. Daubert et al., "Current Copier Cells", Electronics Letters, vol. 24, No. 25, Dec. 1988, pp. 1560–1562.

D.W.J. Groeneveld et al., "A Self–Calibration Technique for Monolithic High–Resolution D/A Converters," IEEE Journal of Solid State Circuits, vol. 24, No. 6, Dec. 1989, pp. 1517–1522.

J.B. Hughes et al., "S²I: A Switched—Current Technique For High Performance", Electronics Letters, vol. 29, No. 16, Aug. 5, 1993, pp. 1400–1401.

Primary Examiner—Timothy P. Callahan
Assistant Examiner—Jung Ho Kim

[57] ABSTRACT

A current copier is disclosed having a reduced transconductance at the output to reduce the corresponding amount of deviation of the current sample. The disclosed current copier may be implemented on an integrated circuit and includes a residue circuit for receiving an input current at an input node during a first operating cycle, for generating an estimate current corresponding to the input current, and for generating a residue current from the input current and the estimate current; and a first current copier for storing the residue current during the first operating cycle, and for generating an output current from the stored residue current during a second operating cycle.

19 Claims, 3 Drawing Sheets

CURRENT COPIERS WITH IMPROVED ACCURACY

BACKGROUND OF THE INVENTION

1. Field of the Invention

This disclosure relates generally to current sampling cells, and in particular, to current copiers for use in analog-to-digital converters (ADC).

2. Description of the Related Art

Current copiers are known in the art to sample and switch input signals for storage, for example, as described in S. J. Daubert et al., "Current Copier Cells", ELECTRONICS LETTERS, VOL. 24, NO. 25, Dec. 1988, pp. 1560-1562; and in J. B. Hughes et al., "$S^2I$: A Switched-Current Technique for High Performance", ELECTRONICS LETTERS, VOL. 29, NO. 16, Aug. 5, 1993, pp. 1400-1401. Such current copiers may use a storage device such as a circuit having a capacitance, which may be a gate capacitance of a transistor (typically a metal oxide semiconductor field effect transistor (MOSFET)) and an optional capacitor circuit. Switch feedthrough is known to reduce the accuracy of current copier circuits, where gate-to-drain and gate-to-source overlap capacitance charges and channel charges may be applied to the storage capacitance, which in turn corrupts the gate voltage sample of the transistor and the resulting current sample. Generally, the amount of deviation from a correct value of the current sample is $\Delta V\, G_m$, where $\Delta V$ is the change in gate voltage due to switch feedthrough and $G_m$ is the transconductance of the storage device. Such deviation produces an undesirable offset and distortion to the extent that both $\Delta V$ and $G_m$ are functions of the amplitude of the input signal, and the resulting feedthrough generally limits current copier accuracy to, for example, about 0.1% error.

SUMMARY

A current copier is disclosed having a reduced transconductance at the output to reduce the corresponding amount of deviation of the current sample. The disclosed current copier may be implemented on an integrated circuit and includes a residue circuit for receiving an input current at an input node during a first operating cycle, for generating an estimate current corresponding to the input current, and for generating a residue current from the input current and the estimate current; and a first current copier for storing the residue current during the first operating cycle, and for generating an output current from the stored residue current during a second operating cycle.

BRIEF DESCRIPTION OF THE DRAWINGS

The features of the disclosed current copiers and method of operation will become more readily apparent and may be better understood by referring to the following detailed description of an illustrative embodiment of the present invention, taken in conjunction with the accompanying drawings, where.

DESCRIPTION OF THE PREFERRED EMBODIMENTS

Figure 1:
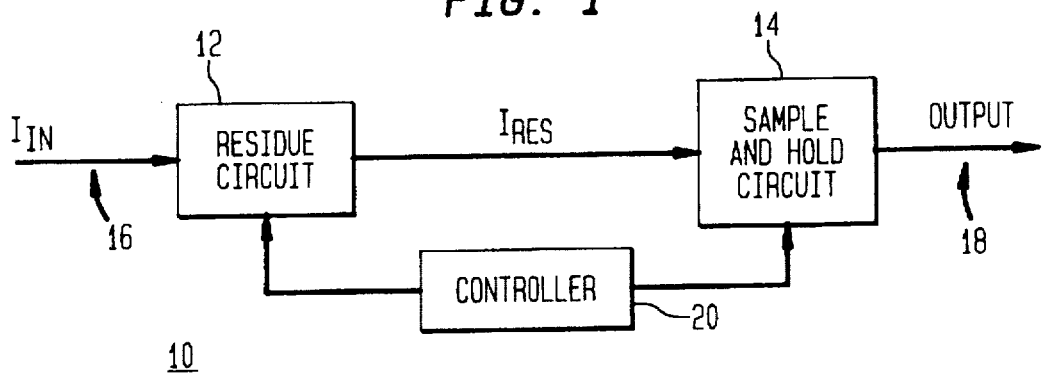
FIG. 1 illustrates a block diagram of the disclosed current copier.

Referring now in specific detail to the drawings, with like reference numerals identifying similar or identical elements, as shown in FIG. 1, the present disclosure describes current copiers and methods of operation having improved accuracy. In the disclosed current copiers, the current error due to feedthrough is reduced to obtain improved current copier accuracy.

In designing a current copier circuit, the $G_m$ may be chosen such that the full desired current storage range or full scale range $I_{FS}$ is achieved over the allowable gate voltage switch range $V_{SW}$, where $G_m = I_{FS}/V_{SW}$. The feedthrough error is $\Delta V\, G_m$, so:

$$\frac{\text{Current Sample Error}}{\text{Full Scale Current}} = \frac{\Delta V G_m}{I_{FS}} = \frac{\Delta V}{V_{SW}} \quad (1)$$

where $G_m$ is approximately constant, $\Delta V$ is generally on the order of millivolts (mV), and $V_{SW}$ is on the order of 1 Volt. From Equation (1) above, it may be shown that the feedthrough generally limits current copier accuracy to about 0.1% error.

In the disclosed current copiers and method of operation thereof, instead of storing currents that may vary over a range of 0 to $I_{FS}$, the disclosed current copiers subtract from the input current $I_{IN}$ a coarse resolution estimate current $I_{EST}$ generated, for example, by an M-bit high accuracy ADC or by any equivalent means known in the art.

As illustrated by the block diagram in FIG. 1, the disclosed current copier 10 includes a residue circuit 12 and a sample-and-hold (S/H) circuit 14 which may be a current copier circuit. The residue circuit 12 receives an input signal such as an input current $I_{IN}$ at an input node 16, generates the coarse resolution estimate current $I_{EST}$ and subtracts the $I_{EST}$ current from the $I_{IN}$ current to generate a residue current $I_{RES} = I_{IN} - I_{EST}$ which is provided to the S/H circuit 14 for storage and copying as an output signal at output 18. The current copier 10 may include or is operatively connected to a controller 20 which provides control signals to control the current copying. This circuitry is typically incorporated in an integrated circuit (IC), and may be connected to or incorporated with other circuitry of the IC such as analog-to-digital converters. Such a controller 20 may be incorporated in a control mechanism of the IC including or connected to the current copier 10 in a manner known in the art.

Figure 2:
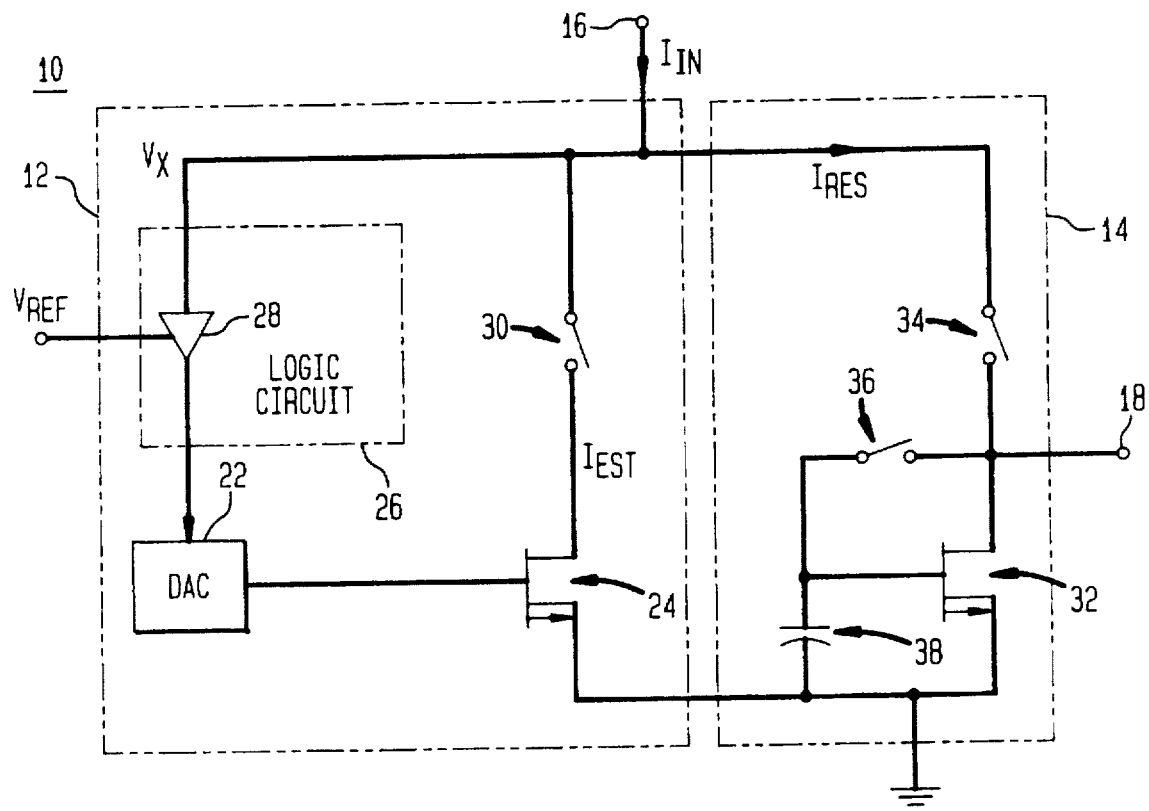
FIG. 2 illustrates an exemplary circuit of the disclosed current copier.

In an exemplary embodiment shown in FIG. 2, the residue circuit 12 includes a digital-to-analog converter (DAC) 22 with a predetermined resolution R and connected to a transistor 24 for generating the coarse resolution estimate current $I_{EST}$. In the exemplary embodiment, the residue circuit 12 also includes a logic circuit 26 operatively connected to the DAC 22. The logic circuit 26 may have, for example, a comparator 28 operatively connected to a reference voltage $V_{REF}$, and other logic known in the art for monitoring $V_x$, a voltage associated with the input node, to adjust and set the output $I_{EST}$ of transistor 24 using the DAC 22 to be one least significant bit (LSB) less than the input current $I_{IN}$, where one LSB is the minimum output step size of $I_{EST}$ that may be programmed using the DAC 22. The transistor 24 is controlled by the logic circuit 26 and the DAC 22 to in turn generate the residue current $I_{RES}$ when the switch 30 is closed.

For storing the analog value $I_{IN}$, the DAC 22 is not required to be linear or binary weighted. The DAC 22 and/or the $I_{EST}$ may be used separately for other applications in an analog-to-digital (A/D) conversion of the input current $I_{IN}$;

if so, $I_{EST}$ is to be determined to an accuracy and resolution consistent with such A/D conversion, and the DAC 22 may include an appropriate accuracy and resolution as well. It is understood that one having ordinary skill in the art may also use the disclosed current copier 10 with other known error control techniques to control and/or reduce sampling errors associated with current copiers, comparators, and other circuits such as those incorporated in integrated circuits for A/D converters.

In operation, the input current $I_{IN}$ ranges from 0 to $I_{FS}$, where $I_{FS}$ is the maximum available $I_{EST}$. For example, with $I_{FS}$ chosen to be within a LSB of $I_{EST}$, $I_{IN}$ may range from 0 to ($I_{EST}$+1 LSB). From the predetermined resolution R of $I_{EST}$ the residue current $I_{RES}$ can vary within the range of 0 to $I_{FS}/R$. For example, for $I_{EST}$ having an M bit resolution, $R=2^M$ so $I_{RES}$ ranges from 0 to $I_{FS}/2^M$. The transconductance $G_m$ of the storage device; i.e. the S/H circuit 14, may be reduced by design to $G_m/2^M$ in order to maintain the same gate swing range $V_{SW}$. The current storage error due to feedthrough is then:

$$\frac{\text{Current Sample Error}}{\text{Residue Current Range}} = \frac{\Delta V \frac{G_m}{2^M}}{\left(\frac{I_{FS}}{2^M}\right)} = \frac{\Delta V}{V_{SW}} \quad (2)$$

which has an identical error as found in Equation (1). However, in the disclosed current copier 10, the error compared to the actual range $I_{FS}$ is:

$$\frac{\text{Current Sample Error}}{\text{Full Scale Current}} = \frac{1}{2^M} \cdot \frac{\Delta V}{V_{SW}} \quad (3)$$

which is less than that shown in Equation (1).

The coarse resolution estimate current $I_{EST}$ is generated without sampling the input current $I_{IN}$ with its associated feedthrough error, and the current copier storage method using the S/H circuit 14 is then applied to the residue current $I_{RES}$ only. This copying of the residue current $I_{RES}$ allows the S/H circuit 14 to have a transconductance $G_m$ to be set at lower values, resulting in less current error due to feedthrough.

In the exemplary embodiment shown in FIG. 2, the S/H circuit 14 is a current copier cell, as described in S. J. Daubert et al., supra, S. J. Daubert et al., "Current Copier Cells", ELECTRONICS LETTERS, VOL. 24, NO. 25, Dec. 1988, pp. 1560–1562, but other sample-and-hold circuits known in the art may also be used as the S/H circuit 14. The S/H circuit 14 shown in FIG. 2 includes a transistor 32 for receiving and storing the residue current $I_{RES}$ when the switches 34, 36 are closed. The residue current $I_{RES}$ is held until switch 36 opens. In the exemplary embodiment, the gate capacitance of the transistor 32 is sufficient for operation of the S/H circuit 14; otherwise, a capacitor 38 may optionally be provided in the S/H circuit 14 to store the residue current $I_{RES}$ therein in conjunction the gate capacitance of the transistor 32.

Figure 3:
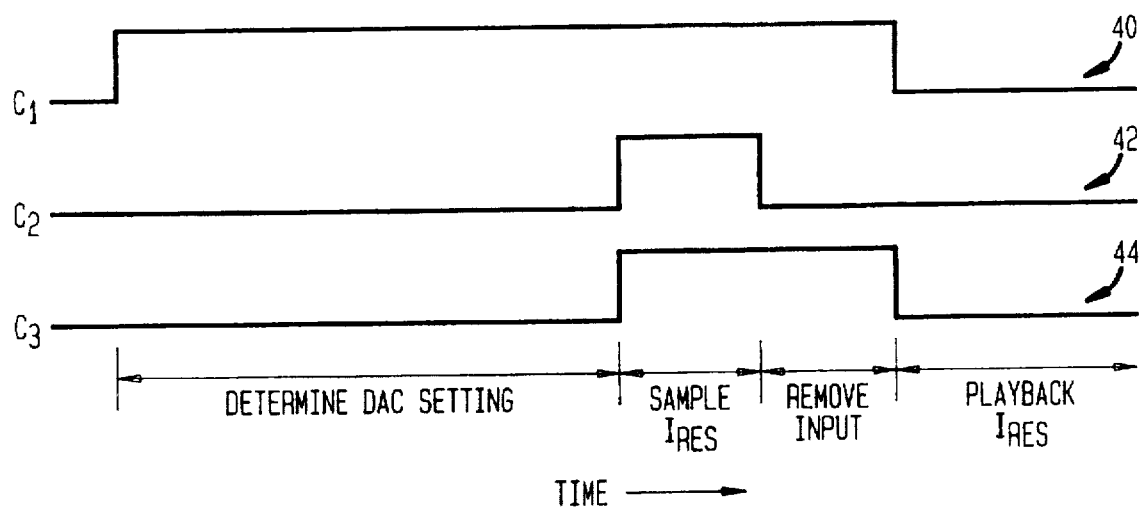
FIG. 3 illustrates clock signals.

The switches 30, 34, 36 are controlled by control signals from the controller 20. In an exemplary embodiment shown in FIG. 3, the control signals may be clock signals 40, 42, 44 determining operating cycles and labelled $C_1$, $C_2$, $C_3$, respectively, for clocking respective switches 30, 34, 36 to close on a high clock value and to open on a low clock value. Such switches 30, 34, 36 may be embodied as transistors such as metal oxide semiconductor field effect transistors (MOSFETs) which respond to and are driven by the clock signals 40–44. It is understood that other types of transistors and equivalent circuits may be employed in a manner known in the art.

In operation, the disclosed current copier 10 shown in FIG. 2 determines a setting for the DAC 22 when clock $C_1$ is high and clocks $C_2$, $C_3$ are low during a first operating cycle. Then the disclosed current copier 10 samples $I_{RES}$ when clocks $C_2$ and $C_3$ go high with $C_1$ high during a second operating cycle. During a third operating cycle, clock $C_2$ goes low which removes the input to transistor 32, and, when clocks $C_1$ and $C_3$ go low during a fourth operating cycle, the sampled current $I_{RES}$ is read out or played back by connecting a desired load at the output 18 to the drain of transistor 32.

Since the generation of a current estimate $I_{EST}$ by the residue circuit 12 is applicable to time-varying input currents $I_{IN}$, the disclosed current copier 10 allows for a reduced transconductance $G_m$ for any input current $I_{IN}$, which is advantageous over other current copiers using reference currents to copy fixed input currents; for example, the circuits described in D. W. J. Groeneveld et al., "A Self-Calibration Technique for Monolithic High-Resolution D/A Converters", IEEE JOURNAL OF SOLID-STATE CIRCUITS, VOL. 24, NO. 6, DEC. 1989, pp. 1517–1522.

Figure 4:
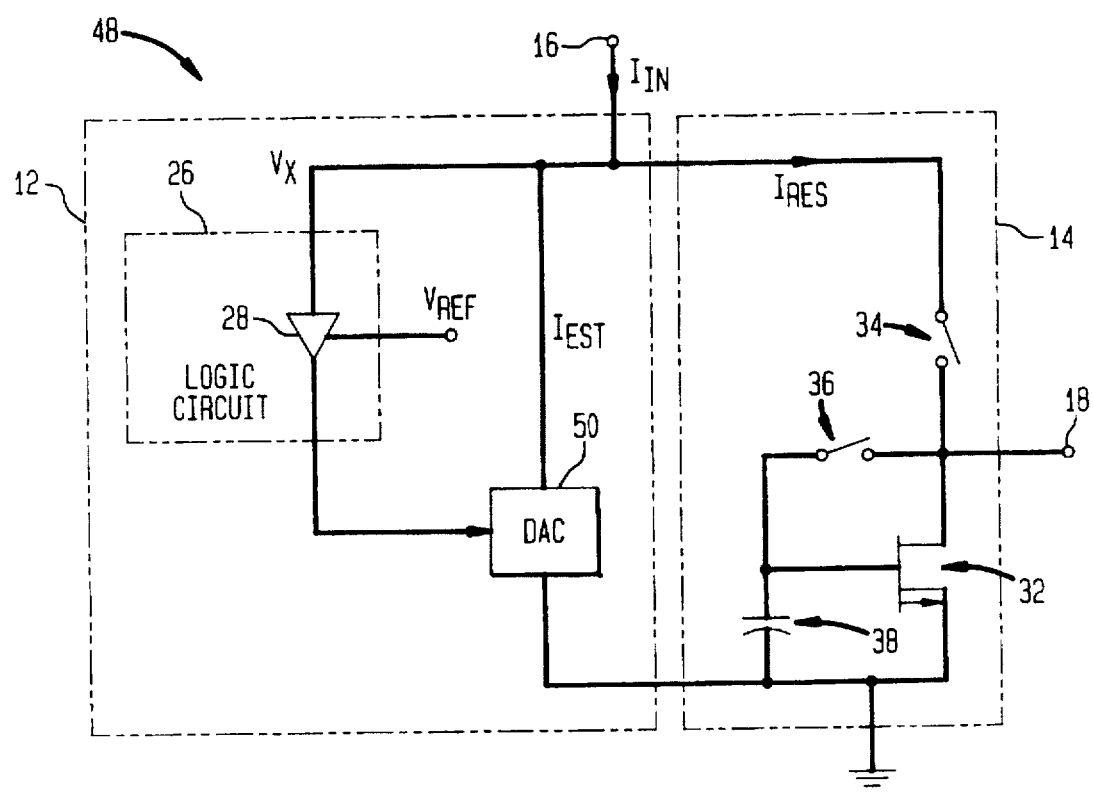
FIG. 4 illustrates an alternative embodiment of the disclosed current copier.

In an alternative embodiment of the disclosed current copier 10 of FIGS. 1–2, the current copier 48 shown in FIG. 4 includes a residue circuit 12 having a logic circuit 26 with a comparator 28 for setting a DAC 50, where the DAC 50 has an accuracy of N bits with N>M. The DAC 50 is set to produce an output current of M bits as the coarse resolution estimate $I_{EST}$. The coarse resolution estimate $I_{EST}$ represents the first M bits of an A/D conversion, and the resulting residue current $I_{RES}$ is generated for further processing by the S/H circuit 14. The DAC 50 may then be used with calibration techniques known in the art for generating an N-bit overall accuracy in the A/D conversion.

Figure 5:
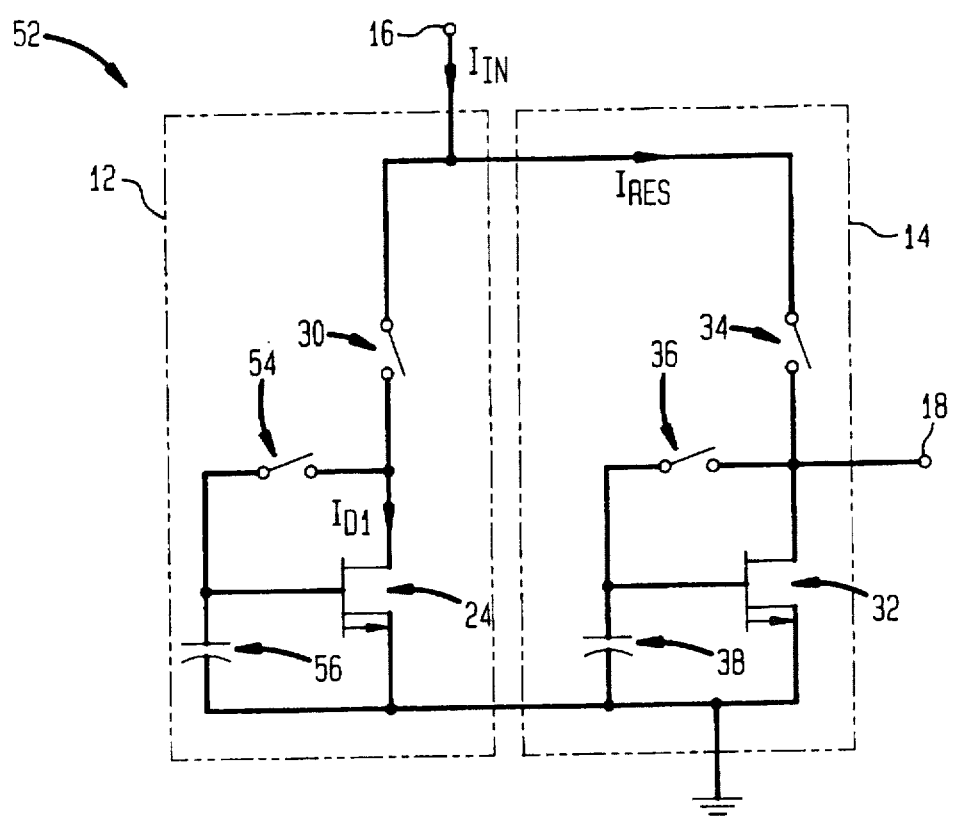
FIG. 5 illustrates another alternative embodiment of the disclosed current copier.

As shown in FIG. 5 for another embodiment of the disclosed current copier 10 of FIG. 1, a current copier 52 has a second sample-and-hold circuit, which may be a current copier circuit, as the residue circuit 12 and connected to the first sample-and-hold circuit 14; i.e. current copier 52 has at least two S/H circuits in parallel. In the exemplary embodiment of the current copier 52, the second S/H circuit is a current copier cell including the transistor 24 and the switch 30, and a second switch 54 is included and controlled by the controller 20. In an exemplary embodiment, the transistors 24, 32 may both be n-channel MOSFETs to facilitate fabrication of the current copier 52.

In operation, the switches 30, 34, 36, 54 are controlled by control signals from the controller 20. In an exemplary embodiment shown in FIG. 3, the control signals may be clock signals 40, 42, 44 and labelled $C_1$, $C_2$, $C_3$ respectively, for clocking respective switches 30, 34, 36, 54 to close on a high clock value and to open on a low clock value. Such switches 30, 34, 36, 54 may be embodied as transistors such as MOSFETs which respond to and are driven by the clock signals. It is to be understood that other types of transistors and equivalent circuits may be employed in a manner known in the art.

In operation, the current copier 52 shown in FIG. 5 has switches 30, 34 close while switch 36 is open when clock signals 40, 42 are high and clock signal 44 is low, respectively. Thus the residue circuit 12 receives and stores the input current $I_{IN}$ using the gate capacitance of the transistor 24 which is sufficient for operation of the residue circuit 12; otherwise, a capacitor 56 may optionally be provided in the residue circuit 12 to store the input current $I_{IN}$ therein in conjunction the gate capacitance of the transistor 24.

The switch 54 may have an associated capacitance which stores current and which reduces the current stored by the transistor 24 and capacitor 56, such that the drain current $I_{D1}$ of the transistor 24 is less than $I_{IN}$. In an exemplary embodiment, the switch 54 may be an n-channel MOSFET driven by a clock signal, which has an associated feedthrough that causes the reduction of the drain current $I_{D1}$ from the applied input current $i_{IN}$. When switch 54 opens while switches 30, 34 remain closed, the stored current of the transistor 24 and capacitor 56 are caused to be read out to the first S/H circuit 14 as the estimate current $I_{EST}$. The resulting $I_{RES}$ is the difference between $I_{IN}$ and $I_{D1}$ which is applied to the first S/H circuit 14.

As discussed above in conjunction with FIG. 2, transistor 32 may then have a reduced $G_m$. The reduced $G_m$ causes the feedthrough to be represented at the output 18 as a reduced current error when switch 36 is closed; i.e. clock signal 44 goes high as clock signals 40, 42 go low.

In other alternative embodiments of FIGS. 1–2 and FIG. 5, the sampling speed of the first S/H circuit 14 with the low $G_m$ may be increased by driving the gate of the transistor 32 with an amplifier (not shown) positioned between the drain and the gate of transistor 32. With a gain of $A_v$, in the amplifier, the sampling time is approximately:

$$\tau = \frac{C}{A_v G_m} \quad (4)$$

where C is the overall storage capacitance of the combination of the transistor 32 and the capacitor 38.

While the disclosed current copier and method have been particularly shown and described with reference to the preferred embodiments, it is understood by those skilled in the art that various modifications in form and detail may be made therein without departing from the scope and spirit of the invention. For example, p-channel switches and bidirectional residue currents may be implemented in accordance with the disclosed current copier and method of use. Accordingly, modifications such as those suggested above, but not limited thereto, are to be considered within the scope of the invention.

What is claimed is:

1. An integrated circuit comprising:

a residue circuit, including a digital-to-analog converter, for receiving an input current at an input node during a first operating cycle, for generating an estimate current as a function of the input current, and for generating a residue current from the input current and the estimate current, wherein the digital-to-analog converter causes an estimate-generating transistor to generate the estimate current and to generate the residue current therefrom; and a current copier for storing the residue current during the first operating cycle, and for generating an output current at an output from the stored residue current during a second operating cycle.

2. The integrated circuit of claim 1 wherein the current copier includes:

a switch for closing during the first operating cycle; and a capacitive element, responsive to the closing of the switch, for storing the residue current during the first operating cycle.

3. The integrated circuit of claim 1 wherein the residue circuit includes:

a logic circuit, responsive to a voltage at the input node, for controlling the digital-to-analog converter to generate the estimate current.

4. The integrated circuit of claim 3 wherein the logic circuit includes a comparator, responsive to the voltage, for generating a comparison signal; and the digital-to-analog converter generates the estimate current from the comparison signal.

5. The integrated circuit of claim 3 wherein the residue circuit includes the estimate-generating transistor; and the digital-to-analog converter, responsive to the logic circuit, driving the estimate-generating transistor to generate the estimate current and the residue current therefrom.

6. The integrated circuit of claim 1 wherein the current copier includes a first n-channel transistor having a gate capacitance for storing the residue current via at least the gate capacitance during the first operating cycle; and the residue circuit includes a second n-channel transistor as the estimate-generating transistor.

7. The integrated circuit of claim 6 wherein the second current copier is connected in parallel with the first current copier.

8. The integrated circuit of claim 6 wherein the residue circuit includes:

a first switch coupled between the estimate-generating transistor and a circuit node at which the input current is applied.

9. A current copier comprising:

a residue circuits including a digital-to-analog converter, for receiving an input current at an input node during a first operating cycle, for generating an estimate current as a function of the input current, and for generating a residue current from the input current and the estimate current, wherein the digital-to-analog converter causes an estimate-generating transistor to generate the estimate current and to generate the residue current therefrom; and a current copier circuit including:

a switch for closing during the first operating cycle; and a capacitive element including a field effect transistor having a gate capacitance, responsive to the closing of the switch, for storing the residue current via at least the gate capacitance during the first operating cycle, said transistor generating an output current at an output from the stored residue current during a second operating cycle.

10. The current copier of claim 9 wherein the residue circuit includes:

a logic circuit, responsive to a voltage at the input node, for controlling the digital-to-analog converter to generate the estimate current.

11. The current copier of claim 10 wherein the logic circuit includes a comparator, responsive to the voltage, for generating a comparison signal; and the digital-to-analog converter responds to the comparison signal to cause the estimate-generating transistor to generate the estimate current.

12. The current copier of claim 10 wherein the residue circuit includes the estimate-generating transistor; and the digital-to-analog converter, responsive to the logic circuit, for driving the estimate-generating transistor to generate the estimate current and the residue current therefrom.

13. The current copier of claim 9 wherein said field effect transistor comprises a first n-channel transistor, and said capacitive element further including a capacitor that stores the residue current in conjunction with said gate capacitance during the first operating cycle; and the residue circuit includes a second n-channel transistor as the estimate-generating transistor.

14. The current copier of claim 13 wherein the residue circuit includes:

a first switch coupled between the estimate-generating transistor and a circuit node at which the input current is applied.

15. In a current copier for copying an input current to a corresponding output current, the current copier having a capacitive element responsive to a switch for storing a portion of the input current during a first operating cycle, and having a transistor for generating an output current during a second operating cycle, the current copier further comprising:

a residue circuit, including a digital-to-analog converter, for receiving the input current at an input node during the first operating cycle, for generating an estimate current corresponding to the input current, and for generating a residue current from the input current and the estimate current, wherein the residue current is a portion of the input current which is converted to the output current by the transistor and switch, and wherein the digital-to-analog converter generates the estimate current, and the residue circuit further including a logic circuit, responsive to a voltage at the input node, for controlling the digital-to-analog converter to generate the estimate current.

16. The improved current copier of claim 15 wherein the residue circuit includes:

a logic circuit, responsive to a voltage at the input node, for controlling the digital-to-analog converter to generate the estimate current.

17. A method for copying a portion of an input current comprising the steps of:

receiving an input current;

driving an estimate-generating transistor using a digital-to-analog converter responsive to the input current;

generating an estimate current as a function of the input current using the estimate-generating transistor;

generating a residue current from the estimate current and the input current;

storing the residue current in a current copier during the first operating cycle; and outputting the residue current during a second operating cycle.

18. The method of claim 17 wherein the step of storing includes the step of:

storing the residue current in a current copier having a transistor and a switch as the current copier; and the step of outputting includes the step of closing the switch during a second operating cycle to output the stored residue current from the transistor.

19. The method of claim 17 including the steps of:

responding to a voltage at an input node;

generating a control signal from the voltage; and controlling, responsive to the control signal, the digital-to-analog converter to perform the step of driving the estimate-generating transistor.

* * * * *